(12) United States Patent
Allenic et al.

(10) Patent No.: US 9,337,376 B2
(45) Date of Patent: *May 10, 2016

(54) METHOD AND APPARATUS PROVIDING MULTI-STEP DEPOSITION OF THIN FILM LAYER

(71) Applicant: First Solar, Inc., Perrysburg, OH (US)

(72) Inventors: Arnold Allenic, San Jose, CA (US);
Zhigang Ban, Perrysburg, OH (US);
John Barden, Ottawa Hills, OH (US);
Benjamin Milliron, Toledo, OH (US);
Rick C. Powell, Ann Arbor, MI (US)

(73) Assignee: First Solar, Inc., Perrysburg, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/551,707

(22) Filed: Nov. 24, 2014

(65) Prior Publication Data

US 2015/0079725 A1    Mar. 19, 2015

Related U.S. Application Data

(63) Continuation of application No. 13/966,663, filed on Aug. 14, 2013, now Pat. No. 8,921,147.

(60) Provisional application No. 61/684,158, filed on Aug. 17, 2012.

(51) Int. Cl.
| | | |
|---|---|---|
| *H01L 21/00* | (2006.01) | |
| *H01L 31/18* | (2006.01) | |
| *C23C 14/22* | (2006.01) | |
| *H01L 21/02* | (2006.01) | |

(Continued)

(52) U.S. Cl.
CPC ........ *H01L 31/1828* (2013.01); *C23C 14/0629* (2013.01); *C23C 14/228* (2013.01); *C23C 14/243* (2013.01); *C23C 14/246* (2013.01); *H01L 21/0257* (2013.01); *H01L 21/02557* (2013.01); *H01L 21/02562* (2013.01); *H01L 21/02573* (2013.01); *H01L 21/02581* (2013.01); *H01L 21/02617* (2013.01); *H01L 21/02631* (2013.01); *H01L 31/02963* (2013.01)

(58) Field of Classification Search
CPC ............ C23C 14/228; H01L 21/02518; H01L 21/02562
USPC ............. 438/95, 483, 590; 118/719, 724, 726
See application file for complete search history.

(56) References Cited

U.S. PATENT DOCUMENTS

| | | | |
|---|---|---|---|
| 4,841,908 | A | 6/1989 | Jacobson et al. |
| 5,016,562 | A | 5/1991 | Madan et al. |

(Continued)

FOREIGN PATENT DOCUMENTS

| | | | |
|---|---|---|---|
| WO | WO 2007/061273 A1 | 5/2007 | |
| WO | WO 2013/074345 A1 | 5/2013 | |

OTHER PUBLICATIONS

R.C. Powell, "Research Leading to High-Throughput Manufacturing of Thin-Film CdTe PV Modules", Annual Subcontract Report, Sep. 2004-Sep. 2005, NREL/SR-520-39669, Apr. 2006.

(Continued)

*Primary Examiner* — Kevin M Picardat
(74) *Attorney, Agent, or Firm* — Blank Rome LLP

(57) ABSTRACT

A multi-stage method and apparatus for vaporizing and depositing a tellurium containing semiconductor material on a substrate.

15 Claims, 5 Drawing Sheets

(51) Int. Cl.
  *C23C 14/06* (2006.01)
  *C23C 14/24* (2006.01)
  *H01L 31/0296* (2006.01)

(56) References Cited

U.S. PATENT DOCUMENTS

| | | |
|---|---|---|
| 5,945,163 A | 8/1999 | Powell et al. |
| 8,921,147 B2 * | 12/2014 | Allenic et al. ................ 438/95 |
| 2006/0024442 A1 | 2/2006 | Ovshinsky |
| 2009/0148669 A1 | 6/2009 | Basol |
| 2009/0223551 A1 | 9/2009 | Reddy et al. |
| 2010/0087016 A1 | 4/2010 | Britt et al. |
| 2010/0288359 A1 | 11/2010 | Xiong et al. |
| 2011/0027462 A1 | 2/2011 | Hwang et al. |
| 2011/0139240 A1 | 6/2011 | Allenic et al. |
| 2011/0139251 A1 | 6/2011 | Robinson et al. |
| 2011/0165326 A1 | 7/2011 | Little et al. |
| 2012/0027921 A1 | 2/2012 | Feldman-Peabody et al. |
| 2012/0067407 A1 | 3/2012 | Fujdala et al. |
| 2013/0130475 A1 | 5/2013 | Barden et al. |

OTHER PUBLICATIONS

Robert W. Birkmire et al., "Polycrystalline Thin Film Solar Cells: Present Status and Future Potential", Annu. Rev. Mater. Sci 1997. 27:625-53.

* cited by examiner

METHOD AND APPARATUS PROVIDING MULTI-STEP DEPOSITION OF THIN FILM LAYER

CROSS REFERENCE TO RELATED APPLICATION

This application is a continuation of U.S. patent application Ser. No. 13/966,663, filed Aug. 14, 2013 which claims priority to U.S. Provisional Application No. 61/684,158, filed Aug. 17, 2012, which are hereby fully incorporated by reference herein.

FIELD OF THE INVENTION

The present invention relates to the vapor deposition of a thin film material, for example, a thin film semiconductor material used in photovoltaic devices such as photovoltaic cells and modules containing a plurality of such cells.

BACKGROUND OF THE INVENTION

Thin film photovoltaic devices may contain several material layers deposited sequentially over a substrate, including semiconductor material layers which form a p-type absorber layer and an n-type window layer. Vapor deposition is one technique which can be used for depositing semiconductor material layers over a substrate. In vapor deposition a semiconductor material in solid form is vaporized under high temperatures with the vapor flow being directed towards a substrate where it condenses on the substrate as a thin solid film. One such vapor deposition technique is known as vapor transport deposition (VTD). An example of a known vapor transport deposition system can be found in U.S. Pat. No. 5,945,163. In a VTD system, as shown in U.S. Pat. No. 5,945,163, a semiconductor material in a powder form, is continuously supplied to the interior of a permeable vaporization chamber with the assistance of a carrier gas. The vaporization chamber is heated to a high temperature sufficient to vaporize the powder, with the vapor passing through a permeable wall of the vaporization chamber. The vapor is then directed by a distributor towards, and condenses as a thin film on, a substrate which moves past one or more orifices of the distributor which direct the vapor towards the substrate.

In order to achieve a high production line throughput, each semiconductor material is deposited in a single stage deposition as a single layer on the substrate to a desired thickness. To achieve the desired thickness with a high production speed, a large volume of semiconductor powder must be vaporized in a short time which requires that the semiconductor powder be heated to a high temperature in the vaporization chamber. Temperatures typically used for VTD deposition are in the range of about 500° C. to about 1200° C., with higher temperatures in this range being preferred for a high deposition throughput. The vaporization chamber can be formed as a heatable tubular permeable member formed of silicon carbide (SiC). The distributor can be formed of a shroud of ceramic material, such as mullite. Vapor deposition occurs within a housing which contains a substrate transport mechanism such as driven rollers. Ceramic sheets may also be used as heat shields within the housing. When the semiconductor material to be deposited contains tellurium, vaporization at the higher temperature can cause materials of the tubular permeable member, the mullite shroud, ceramic sheets and other equipment associated with the deposition to also vaporize and chemically react with tellurium to form a tellurium chemical species vapor which can be deposited with the tellurium containing semiconductor material. This, in turn, leads to undesired impurities being present in the deposited semiconductor film as a contaminant. Some of these impurities may include one or more of tantalum (Ta), cobalt (Co), copper (Cu), vanadium (Va), iron (Fe), antimony (Sb), zirconium (Zr), tin (Sn), silicon (Si) and aluminum (Al). If the impurities have a high enough concentration in the deposited film, they may adversely affect the electrical performance of the tellurium containing semiconductor material.

On the other hand, it may be desirable to add dopants during the vapor deposition of the tellurium containing semiconductor material to achieve a desired dopant concentration in the deposited films. As an example, silicon (Si) has been used as a dopant in some tellurium containing semiconductor films. However, it is difficult to control the silicon (Si) dopant concentration in the deposited film if silicon (Si) is also uncontrollably being introduced as an impurity vapor from the heated silicon carbide (SiC) tubular permeable member during high temperature deposition. For an impurity such as silicon (Si) which may be desired in the deposited tellurium containing semiconductor material as a dopant the silicon atomic concentration should be limited to the range of about $1\ e16/cm^3$ to about $1\ e18/cm^3$ in a deposited film. This will ensure that silicon is present at a level to be effective, but not at a level which may be detrimental to operation of the deposited tellurium containing semiconductor material. In addition, any individual impurity, whether desired or not, should be limited to have an atomic concentration of less than or equal to about $1\ e18/cm^3$ and also be uniformly distributed in the deposited tellurium containing semiconductor material. Vapor deposition at higher temperatures can result in a non-uniform impurity distribution in the deposited film.

Accordingly, a method and apparatus for better controlling the amount of impurities which are being vaporized, reacted with tellurium and incorporated into a deposited tellurium containing semiconductor thin film is desired.

DETAILED DESCRIPTION OF THE INVENTION

Embodiments of the invention better control of the amount of impurities present in a deposited tellurium containing semiconductor film by splitting the vaporization of the semiconductor material into a plurality of multiple vaporization chambers, each of which vaporizes the semiconductor material at a lower temperature to lower and thus better control the amount of volatile impurities which react with tellurium and are carried to a deposited tellurium containing semiconductor film. Throughput speed of the deposition coating of substrates with the tellurium containing semiconductor material is maintained by the plurality of multiple vaporization chambers and their associated distributors for depositing the tellurium containing semiconductor on a substrate. In some embodiments, the multi-stage vaporization and deposition of the tellurium containing layer on the substrate also allows more time for growth of the tellurium containing semiconductor layer on the substrate at each deposition step which in turn provides a desired larger grain size in the deposited layer. A larger grain size in a tellurium containing absorber layer has been found to increase photo conversion efficiency.

Although embodiments of the invention will be described herein with reference to depositing a thin film cadmium telluride (CdTe) absorber layer for a photovoltaic device, the embodiments can be used to deposit other tellurium containing semiconductor films, including but not limited to zinc telluride (ZnTe), cadmium zinc telluride ($CdZn_xTe_{1-x}$), zinc sulfur telluride ($ZnS_xTe_{1-x}$), and cadmium sulfur telluride ($CdS_xTe_{1-x}$), where x is greater than zero and less than one, and other binary and ternary tellurium containing semiconductor materials. The deposited tellurium containing semiconductor materials can be used as an absorber layer or for some other functional layer within a photovoltaic device.

The multi-vaporizer deposition at a lower temperature than used in a single vaporizer deposition allows the deposition of a film having impurities which can be more easily controlled to be in an atomic concentration of less than or equal to about 1 e18/$cm^3$, and for desired dopants and their corresponding impurities such as Si, to be in the atomic concentration range of about 1 e16/$cm^3$ to about 1 e18/$cm^3$. The impurities will also have a uniform presence in the deposited film that differs by no more than 1% throughout the deposited film.

Figure 1:
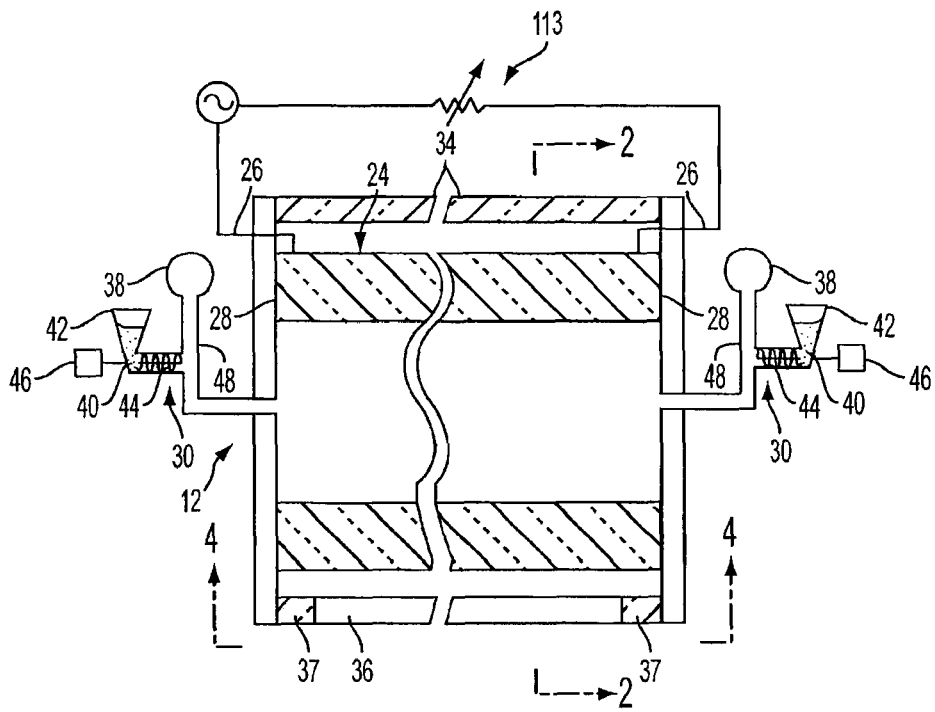
FIG. 1 illustrates in side view a known deposition apparatus which may be employed in an embodiment of the invention.
Figure 2:
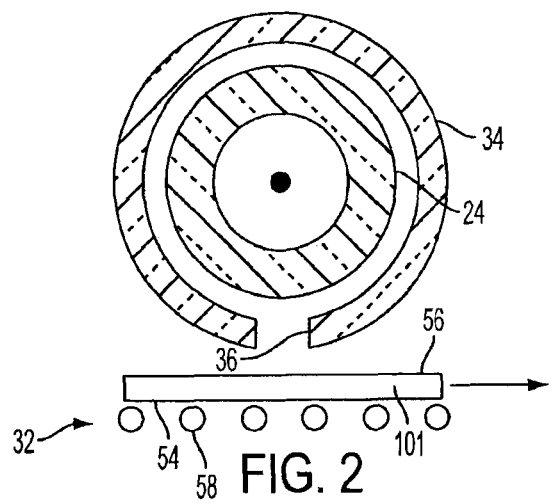
FIG. 2 illustrates a sectional view along the lines 2-2 of FIG. 1.

Turning to the drawings, FIGS. 1 and 2 show in side and cross-sectional views an example of one deposition apparatus 12 which can be used to implement various embodiments of the invention. The apparatus 12 includes an electrically conductive tubular permeable member 24 and having an elongated construction. The tubular permeable member 24 is heated, which is preferably performed by electrical connections 26 at its opposite ends 28 and application of a voltage along its length. This voltage causes an electrical current to flow along the length of the tubular permeable member 24 to provide electrical heating which vaporizes a powder material flowing into the tubular permeated member. At least one material supply 30 of the apparatus 12 is provided for introducing a carrier gas and a semiconductor material in powder form into the tubular permeable member 24. The powdered semiconductor material is vaporized by the heated tubular permeable member and the vapor passes outwardly through the permeable wall of the tubular permeable member 24 to a flow path defined by the outside of tubular permeable member 24 and a distributor in the form of a shroud 34 having one or more vapor outlets 36 formed as one or more openings in shroud 34. A conveyor 32 having driven rollers 55 conveys a glass sheet substrate 101 adjacent the one or more outlets 36 for deposition of the vapor on the substrate as a semiconductor layer.

Figure 3:
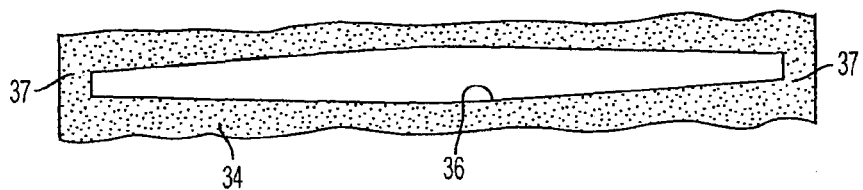
FIG. 3 illustrates a bottom view of a portion of FIG. 2.

The tubular permeable member 24 is made of silicon carbide which is electrically conductive to provide the heating in the manner disclosed. The shroud 34 can be made of a ceramic material such as mullite and is of a generally tubular shape and surrounds the tubular permeable member 24, as best illustrated in FIG. 2. As one example, the shroud 34 has the one or more outlets 36 constructed as a slit-shaped outlet 36 that extends along the length of tubular shroud 34. The shroud 34, as shown in FIG. 3, has opposite ends 37 between which the slit-shaped outlet 36 has a varying size which facilitates distribution of the vapor and uniform deposition of the semiconductor layer. More specifically, the slit-shaped outlet 36 has a smaller size adjacent the ends 37 where the carrier gas and semiconductor material are introduced, as is hereinafter more fully described, and has a larger size at the central more remote area from that introduction so as to provide a uniform vapor deposition on the glass substrate 101. As noted, outlet 36 can also alternatively be in the form of a plurality of outlets 36 extending along the length of shroud 34.

To provide good distribution of the semiconductor material, it may be desirable to provide the interior of the tubular permeable member 24 with a suitable diverter that provides a uniform passage of the vapor outwardly along the length of the tubular permeable member and then along the length of the slit-shaped opening 36 of the shroud.

The shroud 34 also advantageously reduces radiant heat transfer from the hot tubular permeable member 24 to the glass sheet substrate 101. More specifically, the amount of energy the shroud 34 radiates to the glass sheet substrate is reduced because its outside surface temperature is lower than that of the hot tubular permeable member 24. Mullite has an adequately low emissivity and is relatively strong and easy to fabricate. In addition, it should be appreciated that coatings such as $Al_2O_3$ or $Y_2O_3$ can be provided on the shroud 34 to lower the emissivity of the outer surface of the shroud 34.

It should also be noted that the length of the slit-shaped outlet 36 of the shroud 34 can be selected to control the extent of the width of the deposited layer on the glass sheet substrate. Thus, the length of the split-shaped outlet 36 can be selected to be less than the width of the glass sheet substrate 101 to provide a strip of the deposited layer. Such control can also minimize waste of the vapors. When the entire width of the substrate is to be covered, one can make the length of the slit-shaped outlet 36 equal to or slightly less than the width of the substrate 101 such that the substantially all of the vapors are deposited onto the substrate 101 during the deposition. A series of outlets 36 in the form of holes spaced along the length of the shroud 34 can also be used as an alternative to a single slit-shaped outlet 36, through which vapor passes to the substrate 101.

To provide efficient deposition, the shroud 34 can been spaced from the conveyed glass sheet substrate a distance in the range of 0.5 to 3.0 centimeters. while greater spacings could be utilized, that would require lower system pressures and would result in vapor waste due to overspraying. Furthermore, a smaller spacing could cause problems due to thermal warping of the glass sheet substrate during conveyance.

As illustrated in FIG. 1, the material supply 30 introduces a carrier gas from a source 38 and a semiconductor material as a powder 40 from a hopper 42 into one end 28 of the tubular permeable member 24, and there is also another material supply 30 that likewise introduces a carrier gas and a semiconductor material as a powder into the other end 28 of the tubular permeable member 24. As such, there is a good distribution of the carrier gas and entrained semiconductor powder along the entire length of the tubular permeable member 24.

With continuing reference to FIG. 1, each of the material supplies 30 illustrated includes a rotary screw 44 that receives the semiconductor powder 40 from the hopper 42 and is rotatively driven by a suitable actuator 46. A passage 48 extends from the carrier gas source 38 to the adjacent end 28 of the porous tubular member 24 in communication with the rotary screw 44. Rotation of the screw 44 at a controlled rate introduces the semiconductor powder 40 into the passage 48 so as to be entrained therein for flow into the tubular permeable member 24 where it is heated to provide the deposition vapor.

It should be appreciated that other types of material supplies can also be utilized for feeding the semiconductor powder including fluidized bed feeders and rotary disk feeders that are commercially available. The powder feed rate and the speed of conveyance of the glass sheet substrate 101 directly control the film thickness such that the carrier gas flow rate, powder feed rate, and glass sheet conveyance speed are controlled to produce a desired deposited material thickness. Also, starting and stopping of the powder feed can be utilized to commence and terminate the deposition of the semiconductor layer on the glass sheet substrate.

In the structure illustrated in FIGS. 1 and 2, the apparatus 12 is located above the conveyor 32 so as to deposit the semiconductor layer on the upwardly facing surface 56 of the glass sheet substrate 101. Furthermore, the glass substrate conveyor 32 is shown as being of the roll type including driven rollers 58 that support the downwardly facing surface 54 of the glass sheet substrate for its conveyance during deposition, although other conveying mechanisms can also be used.

The carrier gas supplied from the source 38 is an inert gas, for example, helium which has been found to provide good semiconductor characteristics such as dense deposition and good bonding to substrate 101. The carrier gas can also be another inert gas such as nitrogen, neon, argon or krypton, or combinations of these gases. A flow rate of 0.3 to 10 standard liters per minute of the carrier gas has been determined to be sufficient to provide the semiconductor material flow.

One of the semiconductor materials which can be deposited using the FIGS. 1-3 apparatus 12 is a tellurium containing semiconductor material which is deposited on a substrate 101. One example is cadmium telluride (CdTe) which can be deposited as an absorber layer of a photovoltaic device. As noted, tellurium can react with impurities to form a tellurium vapor species which can be deposited with the tellurium containing semiconductor material. Embodiments described below use a plurality of vaporization chambers and associated distributors to lower and better control the level of impurities in the deposited absorber layer. The temperature in each vaporization chamber is lower than that required to produce a desired thickness of a deposited tellurium containing semiconductor layer for the same throughput, when compared to use of a single vaporization chamber.

Figure 4:
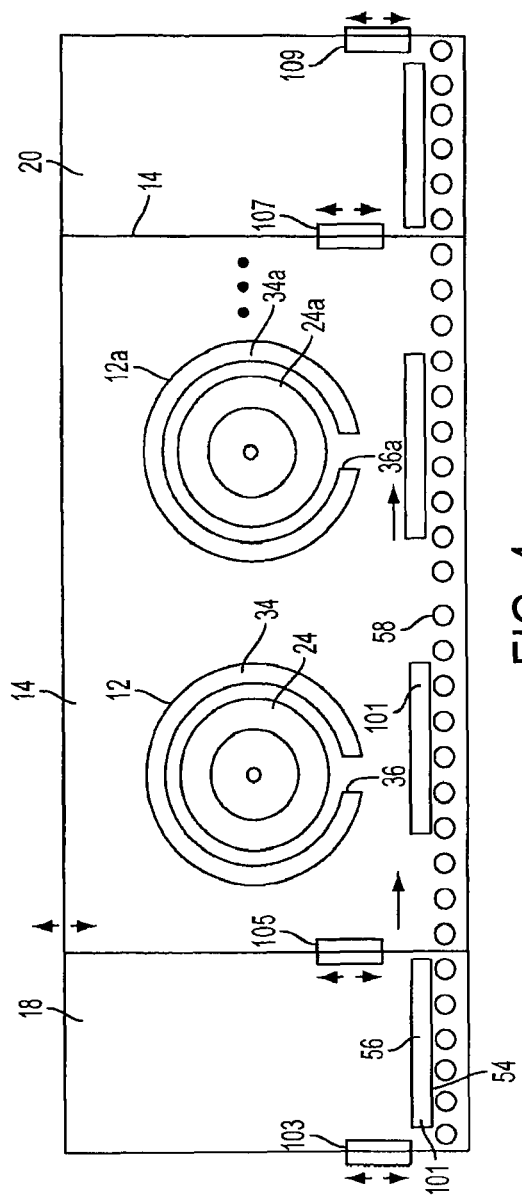
FIG. 4 illustrates a cross-sectional view of an embodiment of the invention.

FIG. 4 shows in a side view a first embodiment in which two separate deposition apparatuses 12, 12a, each constructed as described above with reference to FIGS. 1-3, are provided in common housing 14 and used for sequentially depositing the same telluride containing semiconductor material onto the upper surfaces 56 of substrates 101. Although two deposition apparatuses 12, 12a are shown in FIG. 4, three or more deposition apparatuses can also be used, as indicated by the dots following 12a in FIG. 4. For thin film photovoltaic devices, a thin film layer containing tellurium, e.g. CdTe, may be deposited as an absorber layer over a previously deposited window layer, which may be, for example formed of a thin layer of cadmium sulfide (CdS). Although an example of an absorber layer which can be formed is a cadmium telluride (CdTe) layer, the illustrated embodiment can be used to deposit other tellurium containing semiconductor materials as described above, whether as an absorber layer or as another layer of a photovoltaic device.

First deposition apparatus 12 and second deposition apparatus 12a can each be fed with the same semiconductor material in power form, for example, CdTe. Each apparatus 12, 12a vaporizes the material with the CdTe vapor passing through the porous walls of respective tubular permeable members 24, 24a and into the respective shrouds 34, 34a. The vapor exits shrouds 34, 34a at respective outlets 36, 36a for deposition on a substrate 101 moving on a conveyor 32 which includes driven rollers 58.

Figure 7:
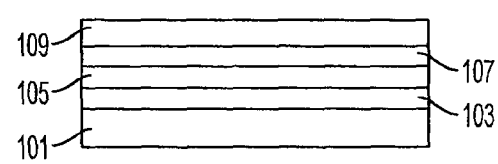
FIG. 7 illustrates one example of a coated substrate which can be used in the FIGS. 4 and 5 embodiments.

As noted, the substrate 101 may be precoated with other deposited materials at upstream processing stations. For example, a photovoltaic module under fabrication may include, as shown in FIG. 7, a glass substrate 101 formed of float glass, borosilicate glass or another glass, a barrier layer 103 formed of silicon nitride or silicon dioxide, or a layer of each, for mitigating against the diffusion of sodium ions from substrate 101 into a photovoltaic device during or after fabrication, a transparent conductive oxide layer 105 which may be formed of indium tin oxide (ITO), fluorine doped tin oxide ($SnO_2$:F), aluminum doped zinc oxide ($Z_nO$:Al) or cadmium stannate ($Cd_2SnO_4$), and which acts as one contact for photovoltaic cells of a module, a buffer layer 107 formed of cadmium zinc oxide (Cd:ZnO), tin zinc oxide (SnZnO), or zinc stannate ($Zn_2SnO_4$) for providing a smooth layer on which semiconductor films can be formed, and a semiconductor window layer 109 formed of, for example, CdS. A layer of $CdS_xTe_{1-x}$ may also be optionally formed over the CdS window layer 109 prior to entry of the coated substrate 101 into housing 14. The coated substrate 101 of FIG. 7 enters processing housing 14 through an entry station 18, which may be constructed as a conventional load lock with vertically moveable entry 103 and exit 105 doors, and exits processing housing 14 by an exit station 20 which may also be constructed as a conventional load lock with vertically moveable entry 107 and exit 109 doors. It should be understood that FIG. 7, with or without a $CdS_xTe_{1-x}$ layer over the CdS layer 109, is just one example of a coated substrate 101 on which may be deposited a tellurium containing semiconductor layer using the FIG. 4 apparatus. Substrate 101 having other coatings thereon may also be used.

Upon entering the processing housing 14, the coated substrate passes sequentially below the first deposition apparatus 12 and the second deposition apparatus 12a, each of which deposits a thin film of CdTe or other tellurium containing semiconductor layer on the coated substrate 101. Each of the tubular permeable members 24 and 24a are heated to a temperature less than or equal to 1050° C., which is at a temperature lower than required for a single stage deposition of the absorber layer material at the same substrate throughput rate and to the same desired deposited material thickness, and low enough to limit and/or control the amount of impurities which chemically combine with tellurium in the deposition vapor. In addition, each deposition apparatus 12, 12a only needs to deposit a portion of the total desired thickness of the tellurium containing layer, which also allows for a longer CdTe growth time for each of the sequentially deposited CdTe layers, than would occur if the desired thickness of CdTe was deposited in a single stage deposition at the same substrate 101 throughput rate.

The deposition apparatuses 12 and 12a can be configured to each deposit half of the total desired thickness of the tellurium absorber layer or they can be configured to deposit different thicknesses which together form the total desired absorber layer thickness. The desired CdTe thickness of an absorber layer is in the range of 1 um to 10 um. The power feed rate to each of the permeable tubes 24, 24a is also lower compared to what is required to form a tellurium containing semiconductor layer of a desired thickness in a single deposition step. If each deposition apparatus 12 and 12a deposits half of the absorber layer thickness, the powder feed rate for each can also be half that used in a single stage absorber layer deposition. The operating temperature of the permeable tubes 24, 24a and powder flow rates to each of the tubes 24, 24a can also be the same or different.

If desired, a dopant, such as silicon (Si) can be introduced into the tellurium semiconductor material vapor by being mixed in with the powder which is vaporized or by being introduced in the carrier gas.

It has been found that using a multiple stage vaporization and deposition of a telluride containing semiconductor material at a temperature less than or equal to 1050° C. reduces and better controls the amount of impurities present in the deposited semiconductor layer to a concentration of less than or equal to about 1 e18/cm$^3$ and for desired dopants, such as silicon Si within the concentration range of about 1 e16/cm$^3$ to about 1 e18/cm$^3$. In addition, the impurities are more uniformly distributed in the deposited film such that there is no more than a 1% variation in impurity concentration throughout the deposited film.

Figure 5:
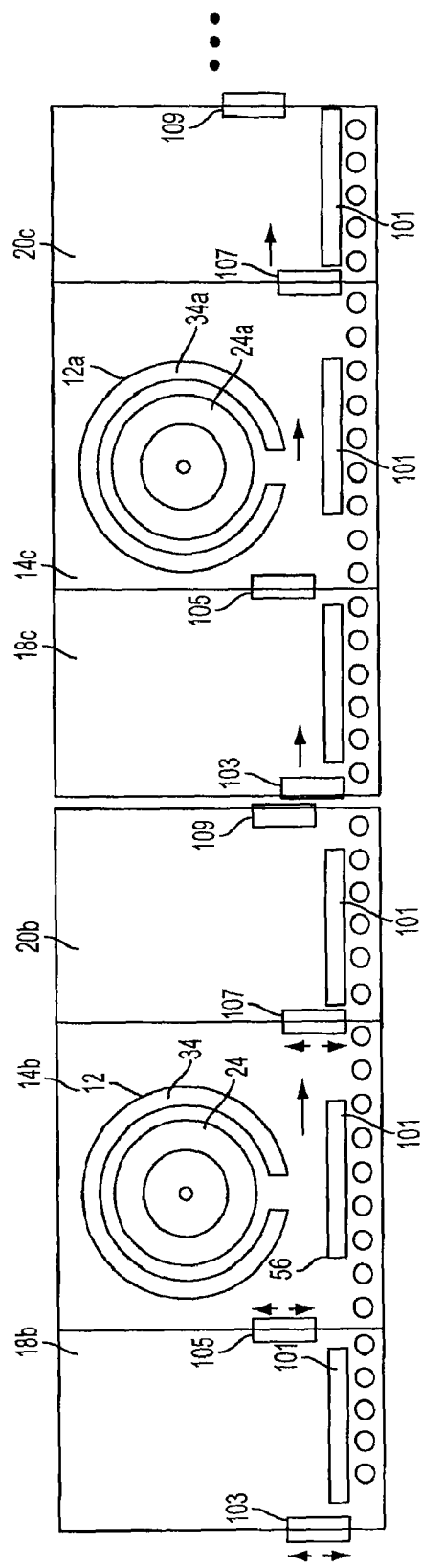
FIG. 5 illustrates a cross-sectional view of another embodiment of the invention.

FIG. 5 shows another embodiment in which each deposition apparatus 12, 12a is provided within a respective deposition housing 14b, 14c, each having associated entry and exit staging areas 18b, 20b and 18c, 20c and which may each include a conventional load lock structure having entry and exit doors. In this arrangement, since each deposition apparatus 12, 12a has an associated housing 14b, 14c, each can have a separate processing environment, including pressure and gaseous atmosphere. Otherwise, each apparatus 12, 12a operates as described above with respect to FIG. 4.

Following the absorber layer deposition within housings 14, or 14b and 14c, the coated substrate 101 passes to exit staging area 20c and from there to further substrate processing to fabricate additional material layers over substrate 101.

Once again, the dots shown in FIG. 5 indicate that more than two, e.g. three or more, deposition housings, each containing a respective deposition apparatus 12, also can be employed. It is also possible to use a single load lock staging area between adjacent housings e.g. between 14b, 14c.

Figure 6:
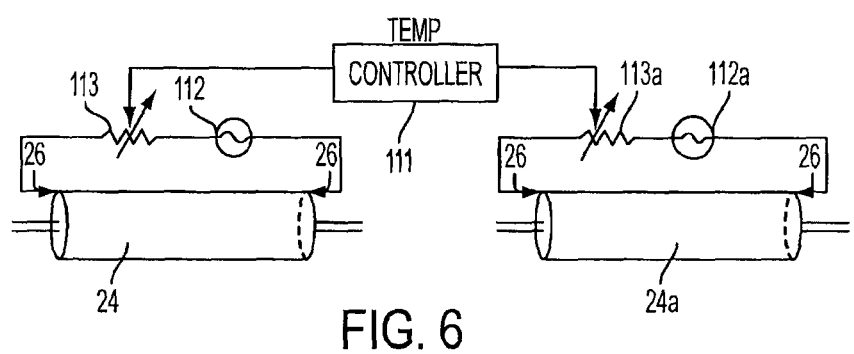
FIG. 6 illustrates a control system which may be used in embodiments of the invention.

FIG. 6 illustrates a control system for controlling the temperature of the SiC permeable tubes 24 and 24a. A respective power source 112, 112a supplies a voltage and current to the opposite ends of respective tubular permeable members 24, 24a. Since the SiC material is resistive the power supplied to each generates the heat used to vaporize the powder material supplied by the material supply 30 (FIG. 1). A temperature controller 111 controls the voltage and/or current supplied by power source 112, 112a to each of the permeable tubes 24, 24a to limit the vaporization temperature of each to be less than or equal to 1050° C. The temperature within each permeable tube 24, 24a can be the same or different. The temperature control is schematically illustrated in FIG. 6 as a variable resistor 113, 113a which is controlled by a temperature controller 111; however, any arrangement which controls the power supplied to the permeable tubes 24, 24a can be used. It should also be understood that while FIG. 6 illustrates temperature control of two vaporizers 24, 24a, the same control can be applied to any number of vaporizers which are used.

Figure 8:
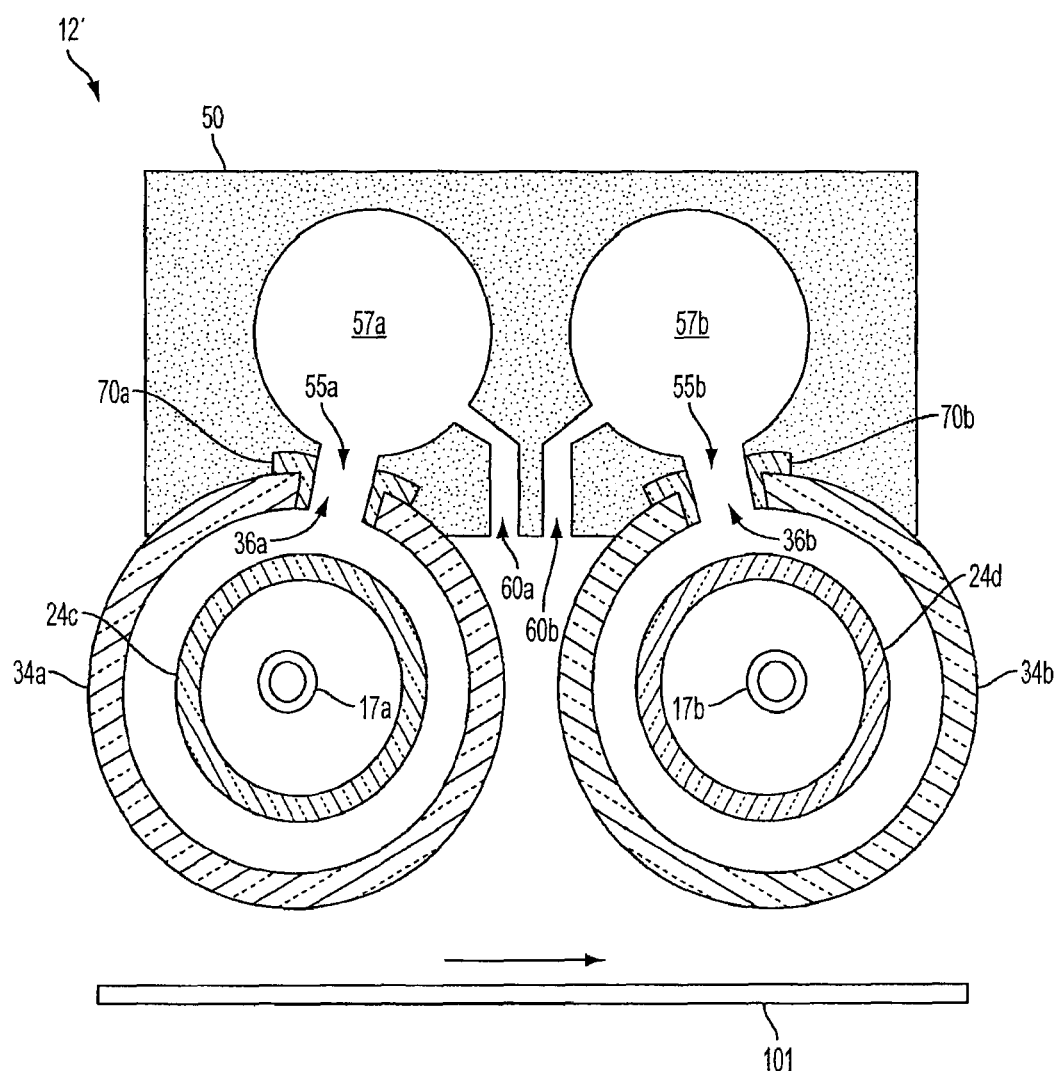
FIG. 8 illustrates a cross-sectional view of another deposition apparatus which may be employed in embodiments of the invention.

FIG. 8 illustrates a cross sectional view of another embodiment of a vaporizer and distributor assembly 12' which can be used to deposit a tellurium containing semiconductor material over a coated substrate. As shown in FIG. 8, vaporizer units constructed as tubular permeable members 24c and 24d are enclosed within respective shrouds 34a, 34b and vapor coupled by respective outlets 36a, 36b to a shared distributor unit 50. Tubular permeable members 24c, 24d are each respectively formed of silicon carbide (SiC) which is heated by a power source in the manner shown in FIG. 6. Each of the tubular permeable members 24d, 24e vaporizes a tellurium containing semiconductor material powder carried by an inert gas, e.g. helium gas or other inert gas, alone or mixed with another inert gas, through respective injection ports 17a, 17b and in the manner described above with respect to FIGS. 1-3. Shrouds 34a, 34b are formed of a ceramic material, for example mullite. The respective shrouds 34a, 34b capture vapor that diffuses through the permeable walls of respective tubular permeable members 24c, 24d and direct the vapor to outlets 36a, 36b and through respective channels 55a, 55b to respective distributor chambers 57a, 57b in distributor unit 50. Respective L-shaped seals 70a, 70b are in respective outlets 36a, 36b and extend into distributor unit 50. L-shaped seals 70a, 70b may be formed of a thermal-conductive material, for example, graphite, or insulator, for example, mullite. Vaporized material collected in chambers 57a, 57b from respective permeable tubular members 24c, 24d is then directed towards respective openings 60a, 60b, which may each be configured as a long slit opening or a plurality of spaced openings along the length of the distributor 50, which direct the vapor out of the distributor unit 50 for deposition onto a substrate 101.

The heated permeable tubular members 24c, 24d provide radiant heat to the surface of the distributor unit 50 sufficient to maintain a temperature at less than or equal to 1050° C. in the distributor chambers 57a, 57b. Thermal insulation may also be applied to the top and/or sides of distributor unit 50 to maintain the desired temperature in the distributor chambers 57a, 57b.

The deposition apparatus 12' of FIG. 8 can be arranged and operated to deposit a tellurium containing semiconductor material in several different ways. In the first, the two permeable tubular members 24c, 24d can be operated alternatively at a temperature less than or equal to 1050° C. in which one of the permeable tubular members 24c, 24d can be taken out of service for maintenance or resupply of powdered tellurium containing semiconductor material while the other continues to operate to deposit a film. In a second, both permeable tubular members 24c, 24d can be operated simultaneously as a single deposition apparatus with a vapor material simultaneously exiting openings 60a, 60b for deposition of a film on substrate 101.

In the first two operational methods, the deposition apparatus 12' can be used as a single step deposition apparatus and a plurality of apparatus 12' can be used to respectively replace the plurality of deposition apparatuses 12 and 12a shown in FIGS. 4 and 5.

In yet a third arrangement and operational mode for apparatus 12', both tubular permeable members 24c and 24d can be operated simultaneously to deposit a thin film tellurium containing semiconductor film, with each operating at a temperature of less than or equal to 1050° C. In this instance, deposition apparatus 12' of FIG. 8 can be arranged in a single housing, e.g. 14, so that permeable tubular member 24c and shroud 34a effectively replace deposition apparatus 12 and permeable tubular member 24d and shroud 34b effectively replace deposition apparatus 12a of FIG. 4.

As with the embodiments shown in FIGS. 4 and 5, the FIG. 8 embodiment can be operated with a temperature of the tubular permeable members 24c, 24d at the same or different temperatures using a control system illustrated in FIG. 6 and with the same or different powder flow rates, whether operated as a single stage deposition apparatus or a standalone two stage deposition apparatus.

As noted, while the embodiments described above can be used to deposit a plurality of tellurium containing absorber layers onto a precoated photovoltaic substrate, they can also be used to deposit multiple layers of other binary and ternary tellurium containing semiconductor materials whether or not used as an absorber layers in a photovoltaic device. It is also possible to use the FIGS. 4 and 5 embodiments to deposit two tellurium containing semiconductor materials, where the two or more deposited tellurium containing semiconductor materials may be the same or different from one another. As one example, the ratio of Cd to Te in the vaporized material may be the same or different for each vaporizer. As another example, one vaporizer can deposit a binary tellurium containing semiconductor material, while the other deposits a ternary tellurium containing semiconductor material. Likewise, the tubular permeable member vaporizers 24c, 24d in FIG. 8 may be operated to deposit the same or different tellurium containing semiconductor materials. In addition, the disclosed embodiments can be used to vapor deposit tellurium containing materials in fields other than photovoltaic device fabrication. Furthermore, although FIG. 7 illustrates one example of a precoated substrate 101 which can be used in the discussed embodiments, the embodiments can also be used to deposit a tellurium containing material on other coated substrates, whether or not the coated substrates are used in the manufacture of photovoltaic devices, and containing other material layers than those employed in the FIG. 7 structure.

In all embodiments, the impurity concentration within the deposited film can be better controlled by the use of multi-stage vaporization at a temperature less than or equal to 1050° C. in each vaporizer.

While various embodiments have been described above they are not limiting of the invention, as variations and changes can be made without departing from the spirit and scope of the invention. Accordingly, the invention is not limited by the foregoing description, but is only limited by the scope of the pending claims.

What is claimed as new and desired to be protected by Letters Patent of the United States is:

1. A method of multi-stage vapor deposition of a semiconductor material, the method comprising:
    flowing a first solid semiconductor material into a first heated chamber to produce a first semiconductor material vapor, wherein the first heated chamber is heated to a temperature of less than or equal to 1050° C.;
    depositing the first semiconductor material vapor onto a substrate to form a first semiconductor material layer;
    flowing a second solid semiconductor material into a second heated chamber to produce a second semiconductor material vapor,
    wherein the second heated chamber is heated to a temperature of less than or equal to 1050° C.; and
    depositing the second semiconductor material vapor as a second semiconductor material layer over the first semiconductor material layer.

2. A method as in claim 1, wherein the first and second solid semiconductor materials are the same material.

3. The method as in claim 1, wherein the first and second solid semiconductor materials are selected from the group consisting of binary tellurium containing semiconductor materials.

4. The method as in claim 1, wherein the first and second solid semiconductor materials are selected from the group consisting of ternary tellurium containing semiconductor materials.

5. The method as in claim 1, wherein the deposited first and second semiconductor material layers form and integrated material layer.

6. The method as in claim 5, wherein first and second material layers form an absorber layer of a photovoltaic device.

7. The method as in claim 1, wherein the first and second solid semiconductor materials comprise CdTe.

8. The method as in claim 5, wherein the integrated material layer has an impurity concentration of less than or equal to about $1\,e18/cm^3$.

9. The method as in claim 5, wherein the integrated material layer has an impurity concentration within the range of about $1\,e16/cm^3$ to about $1\,e18/cm^3$.

10. The method as in claim 9, wherein the impurity comprises silicon.

11. The method as in claim 1, wherein the first and second heated chambers are within a common deposition housing, the method further comprising transporting substrates through the common deposition housing to sequentially receive vapor generated by the first and second heated chambers.

12. The method as in claim 1, wherein the first and second heated chambers are each within a respective deposition housing, the method further comprising transporting substrates sequentially through the respective deposition housings.

13. A method of vapor deposition of a semiconductor material, the method comprising:
    flowing a first solid semiconductor material into a first heated chamber to produce a first semiconductor material vapor;
    depositing the first semiconductor material vapor onto a substrate to form a first semiconductor material layer;
    flowing a second solid semiconductor material into a second heated chamber to produce a second semiconductor material vapor,
    depositing the second semiconductor material vapor as a second semiconductor material layer over the first semiconductor material layer;
    wherein the first and second heated chambers are surrounded by respective first and second shrouds which respectively receive semiconductor material vapor from the heated chambers and direct the first and second semiconductor materials vapor for deposition and wherein the first and second heated chambers and respective shrouds are provided in respective deposition chambers.

14. A method of multi-stage vapor deposition of a tellurium containing semiconductor material, the method comprising:
    flowing a plurality of solid tellurium containing materials respectively into each of a plurality of heated chambers which respectively produce a tellurium containing material vapor;
    directing the respective vapor from each of the plurality of heated chambers sequentially onto a substrate to form a plurality of sequentially deposited material layers;
    controlling the temperature of each of the heated chambers to be less than or equal to 1050° C. such that concentration of an impurity in the deposited material is less than or equal to about $1\,e18/cm^3$; and
    wherein at least one of the heated chambers produces a tellurium containing material vapor which further includes a dopant material, and wherein the material composition of the heated chambers includes the dopant material as a component thereof whereby the controlled temperature of the heated chambers reduces the amount of deposited dopant originating from the heated chamber material composition.

15. A method of multi-stage depositing of a tellurium containing material, the method comprising:

flowing a first solid semiconductor material into a first heated chamber to produce a first semiconductor material vapor;

depositing the first semiconductor material vapor onto a substrate to form a first semiconductor material layer;

flowing a second solid semiconductor material into a second heated chamber to produce a second semiconductor material vapor, depositing the second semiconductor material vapor as a second semiconductor material layer over the first semiconductor material layer;

wherein at least one of the first and second semiconductor materials contains a dopant which is also contained in one of the first and second semiconductor material vapors, and wherein at least one of the first and second heated chambers has a material composition which also contains the dopant, the method further comprising limiting the heating of the first and second heated chambers to values which prevent the dopant in the heated chamber material composition from being vaporized and deposited.

* * * * *